(12) United States Patent
Song et al.

(10) Patent No.: US 9,035,421 B2
(45) Date of Patent: May 19, 2015

(54) HIGH QUALITY FACTOR INDUCTOR IMPLEMENTED IN WAFER LEVEL PACKAGING (WLP)

(71) Applicant: QUALCOMM Incorporated, San Diego, CA (US)

(72) Inventors: Young K. Song, San Diego, CA (US); Yunseo Park, San Diego, CA (US); Xiaonan Zhang, San Diego, CA (US); Ryan D. Lane, San Diego, CA (US); Babak Nejati, San Diego, CA (US); Aristotele Hadjichristos, San Diego, CA (US); Xiaoming Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/787,219

(22) Filed: Mar. 6, 2013

(65) Prior Publication Data

US 2014/0246753 A1 Sep. 4, 2014

Related U.S. Application Data

(60) Provisional application No. 61/771,717, filed on Mar. 1, 2013.

(51) Int. Cl.
| | |
|---|---|
| *H01L 27/08* | (2006.01) |
| *H01L 23/522* | (2006.01) |
| *H01L 23/00* | (2006.01) |
| *H01L 23/64* | (2006.01) |
| *H01L 25/065* | (2006.01) |

(Continued)

(52) U.S. Cl.
CPC ............ *H01L 23/5227* (2013.01); *H01L 24/81* (2013.01); *H01L 23/645* (2013.01); *H01L 25/0657* (2013.01); *H01L 25/074* (2013.01); *H01L 25/117* (2013.01)

(58) Field of Classification Search
CPC ..... H01L 23/5227; H01L 24/81; H01L 28/10; H01L 2924/1205; H01L 2924/19042
USPC .................. 257/531, E21.022; 438/612–617
See application file for complete search history.

(56) References Cited

U.S. PATENT DOCUMENTS

| | | |
|---|---|---|
| 5,519,582 A | 5/1996 | Matsuzaki |
| 6,159,817 A | 12/2000 | Altimari et al. |
| 7,339,452 B2 | 3/2008 | Lee |

(Continued)

OTHER PUBLICATIONS

International Search Report and Written Opinion—PCT/US2014/017580—ISA/EPO—Jun. 5, 2014.

*Primary Examiner* — Brook Kebede
(74) *Attorney, Agent, or Firm* — Loza & Loza, LLP

(57) ABSTRACT

Some novel features pertain to a first example provides a semiconductor device that includes a printed circuit board (PCB), a set of solder balls and a die. The PCB includes a first metal layer. The set of solder balls is coupled to the PCB. The die is coupled to the PCB through the set of solder balls. The die includes a second metal layer and a third metal layer. The first metal layer of the PCB, the set of solder balls, the second and third metal layers of the die are configured to operate as an inductor in the semiconductor device. In some implementations, the die further includes a passivation layer. The passivation layer is positioned between the second metal layer and the third metal layer. In some implementations, the second metal layer is positioned between the passivation layer and the set of solder balls.

54 Claims, 13 Drawing Sheets

(51) Int. Cl.
*H01L 25/07* (2006.01)
*H01L 25/11* (2006.01)

(56) References Cited

U.S. PATENT DOCUMENTS

| | | |
|---|---|---|
| 7,786,837 B2 | 8/2010 | Herbert |
| 7,994,888 B2 | 8/2011 | Ikriannikov |
| 8,212,155 B1 | 7/2012 | Wright et al. |
| 8,558,344 B2 | 10/2013 | Chen |
| 2006/0220210 A1 | 10/2006 | Karnezos et al. |
| 2009/0302436 A1* | 12/2009 | Kim et al. .................... 257/659 |
| 2010/0026368 A1 | 2/2010 | Tang et al. |
| 2010/0314737 A1 | 12/2010 | Henderson et al. |
| 2011/0012228 A1 | 1/2011 | Nakagawa et al. |
| 2011/0170231 A1 | 7/2011 | Chandrasekaran et al. |
| 2011/0317387 A1 | 12/2011 | Pan et al. |
| 2012/0126369 A1 | 5/2012 | Lin et al. |
| 2012/0175732 A1* | 7/2012 | Lin et al. ..................... 257/531 |
| 2012/0187531 A1 | 7/2012 | Lee et al. |
| 2012/0228755 A1 | 9/2012 | Nagano et al. |

* cited by examiner

HIGH QUALITY FACTOR INDUCTOR IMPLEMENTED IN WAFER LEVEL PACKAGING (WLP)

CLAIM OF PRIORITY

The present application claims priority to U.S. Provisional Application No. 61/771,717 titled "High Quality Factor Inductor Implemented in Wafer Level Packaging (WLP)", filed Mar. 1, 2013, which is hereby expressly incorporated by reference herein.

BACKGROUND

1. Field

Various features relate to a high quality factor inductor implemented in wafer level packaging (WLP).

2. Background

Inductors that are located in integrated circuit (IC) packages are limited in their capabilities for supporting high current due to the limited real estate in IC packages. Specifically, since these inductors are located in the packaging substrate of IC packages, the size of these inductors is limited by the size of the packaging substrate of IC packages. As a result of the restricted space in the packaging substrate of IC packages, these inductors typically have a high resistance and a low quality (Q) factor. FIG. 1 conceptually illustrates a semiconductor device that includes an inductor. Specifically, FIG. 1 illustrates a die 100, a packaging substrate 102, a set of solder balls 104, a printed circuit board (PCB) 106, and an inductor 108. As shown in FIG. 1, the die 100 is coupled to the packaging substrate 102. The packaging substrate 102 is coupled to the PCB 106 through the set of solder balls 104. The inductor 108 is defined and located in the die 100.

FIG. 1 also illustrates that some solder balls have been omitted/removed in a region near the inductor 108. This is because solder balls can affect/disrupt the performance of an inductor. More specifically, solder balls that are near an inductor can disrupt the magnetic flux of an inductor, resulting in a low inductance and low Q factor for the inductor, which is why solder balls are removed in a region near an inductor. However, removing solder balls between a packaging substrate and a PCB can affect the structural stability of the packaging substrate and the PCB. Thus, current IC design must weigh the benefit of removing solder balls (e.g., better inductance and Q factor inductor) versus the disadvantage of removing solder balls (e.g., less stable packaging substrate/PCB structure), when determining how many solder balls to use and where to put solder balls when coupling a die and packaging substrate to a PCB.

Therefore, there is a need for an improved inductor design for semiconductor devices. Ideally, such an inductor will have better inductance performance, lower resistance and better quality factor value, without having to sacrifice the structural stability of the semiconductor device.

SUMMARY

Various features relate to a high quality factor inductor implemented in wafer level packaging (WLP).

A first example provides a semiconductor device that includes a printed circuit board (PCB), a set of solder balls and a die. The PCB includes a first metal layer. The set of solder balls is coupled to the PCB. The die is coupled to the PCB through the set of solder balls. The die includes a second metal layer and a third metal layer. The first metal layer of the PCB, the set of solder balls, the second and third metal layers of the die are configured to operate as an inductor in the semiconductor device.

According to one aspect, the PCB further includes a fourth metal layer. In some implementations, the first and fourth metal layers of the PCB, the set of solder balls, the second and third metal layers of the die are configured to operate as the inductor in the semiconductor device.

According to an aspect, the first metal layer of the PCB, the set of solder balls, the second and third metal layers of the die are configured to provide a winding for the inductor of the semiconductor device. The winding has a number of N turns that is 1 or more.

According to one aspect, the die further includes a passivation layer. The passivation layer is positioned between the second metal layer and the third metal layer. In some implementations, the second metal layer is positioned between the passivation layer and the set of solder balls. In some implementations, the second metal layer is a post-passivation layer.

According to an aspect, the first metal layer of the PCB is a trace.

According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides, a semiconductor device that includes a printed circuit board (PCB) comprising a first metal layer. The semiconductor device includes an interconnect means coupled to the PCB, and a die coupled to the PCB through interconnect means. The die includes a second metal layer and a third metal layer. The first metal layer of the PCB, the interconnect means, the second and third metal layers of the die are configured to operate as an inductor in the semiconductor device.

According to an aspect, the PCB further includes a fourth metal layer. In some implementations, the first and fourth metal layers of the PCB, the interconnect means, the second and third metal layers of the die are configured to operate as the inductor in the semiconductor device.

According to one aspect, the first metal layer of the PCB, the interconnect means, the second and third metal layers of the die are configured to provide a winding for the inductor of the semiconductor device. The winding has a number of N turns that is 1 or more.

According to an aspect, the die further includes a passivation layer. The passivation layer is positioned between the second metal layer and the third metal layer. In some implementations, the second metal layer is positioned between the passivation layer and the interconnect means. In some implementations, the second metal layer is a post-passivation layer.

According to one aspect, the first metal layer of the PCB is a trace.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a semiconductor device that includes a first die comprising a first metal layer, a set of solder balls coupled to the first die, and a second die coupled to the first die through the set of solder balls. The second die includes a second metal layer. The first metal layer of the first die, the set of solder balls, the second metal layer of the second die are configured to operate as an inductor in the semiconductor device.

According to an aspect, the first die further includes a third layer metal layer and the second die further comprises a fourth metal layer. In some implementations, the first and third metal layers of the first die, the set of solder balls, the second and fourth metal layers of the second die are configured to operate as the inductor in the semiconductor device.

According to one aspect, the first die further includes a first passivation layer and the second die further includes a second passivation layer. In some implementations, the first metal layer is positioned between the first passivation layer and the set of solder balls. The second metal layer is positioned between the second passivation layer and the set of solder balls.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a semiconductor device that includes a first die comprising a first metal layer, an interconnect means coupled to the first die, and a second die coupled to the first die through the interconnect means. The second die includes a second metal layer. The first metal layer of the first die, the interconnect means, the second metal layer of the second die are configured to operate as an inductor in the semiconductor device.

According to an aspect, the first die further includes a third layer metal layer and the second die further includes a fourth metal layer. In some implementations, the first and third metal layers of the first die, the interconnect means, the second and fourth metal layers of the second die are configured to operate as the inductor in the semiconductor device.

According to one aspect, the first die further includes a first passivation layer and the second die further includes a second passivation layer. In some implementations, the first metal layer is positioned between the first passivation layer and the interconnect means, and the second metal layer is positioned between the second passivation layer and the set of solder balls.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fifth example provides a semiconductor device that includes a first package substrate comprising a first metal layer. The semiconductor device also includes a set of solder balls coupled to the first package substrate, and a second package substrate coupled to the first package substrate through the set of solder balls. The second package substrate includes a second metal layer. The first metal layer of the first package substrate, the set of solder balls, the second metal layer of the second package substrate are configured to operate as an inductor in the semiconductor device.

According to an aspect, the first package substrate further includes a third layer metal layer and the second package substrate further includes a fourth metal layer. In some implementations, the first and third metal layers of the first package substrate, the set of solder balls, the second and fourth metal layers of the second package substrate are configured to operate as the inductor in the semiconductor device.

According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A sixth example provides a semiconductor device that includes a first package substrate comprising a first metal layer, an interconnect means coupled to the first package substrate, and a second package substrate coupled to the first package substrate through the interconnect means. The second package substrate includes a second metal layer. The first metal layer of the first package substrate, the interconnect means, the second metal layer of the second package substrate are configured to operate as an inductor in the semiconductor device.

According to an aspect, the first package substrate further includes a third layer metal layer and the second package substrate further includes a fourth metal layer. In some implementations, the first and third metal layers of the first package substrate, the interconnect means, the second and fourth metal layers of the second package substrate are configured to operate as the inductor in the semiconductor device According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A seventh example provides a method for providing an inductor a semiconductor device. The method provides a die that includes a first metal layer and a second metal layer. The method couples a set of solder balls to the die. The method couples the die to a printed circuit board (PCB) through the set of solder balls. The PCB includes a third metal layer. The coupling of the die to the PCB forms the inductor in the semiconductor device. The inductor defined by the first metal layer, the second metal layer, the set of solder balls, and the third metal layer.

According to an aspect, the PCB further includes a fourth metal layer. In some implementations, the inductor defined by the first metal layer, the second metal layer, the set of solder balls, the third metal layer and the fourth metal layer.

According to one aspect, the die further includes a passivation layer. The passivation layer is positioned between the first metal layer and the second metal layer. In some implementations, the first metal layer is positioned between the passivation layer and the set of solder balls.

According to one aspect, the method further incorporates the semiconductor device into at least one of a music player, a video player, an entertainment unit, a navigation device, a communications device, a mobile device, a mobile phone, a smartphone, a personal digital assistant, a fixed location terminal, a tablet computer, and/or a laptop computer.

An eighth example provides a method for providing an inductor in a semiconductor device. The method provides a first die that includes a first metal layer. The method couples a set of solder balls to the first die. The method couples the first die to a second die through the set of solder balls. The second die includes a second metal layer. The coupling of the first die to the second die forms the inductor in the semiconductor device. The inductor defined by the first metal layer, the set of solder balls, and the second metal layer.

According to an aspect, the first die further comprises a third metal layer. In some implementations, the inductor defined by the first metal layer, the third metal layer, the set of solder balls, and the second metal layer.

According to one aspect, the first die further includes a passivation layer. The first metal layer is positioned between the passivation layer and the set of solder balls.

According to an aspect, the method further incorporates the semiconductor device into at least one of a music player, a video player, an entertainment unit, a navigation device, a communications device, a mobile device, a mobile phone, a smartphone, a personal digital assistant, a fixed location terminal, a tablet computer, and/or a laptop computer.

A ninth example provides a method for providing an inductor in a semiconductor device. The method provides a first package substrate that includes a first metal layer. The method couples a set of solder balls to the first package substrate. The method couples the first package substrate to a second package substrate through the set of solder balls. The second package substrate includes a second metal layer. The coupling of the first package substrate to the second package substrate forms the inductor in the semiconductor device. The inductor is defined by the first metal layer, the set of solder balls, and the second metal layer.

According to an aspect, the first package substrate further includes a third metal layer. In some implementations, the inductor is defined by the first metal layer, the third metal layer, the set of solder balls, and the second metal layer.

According to one aspect, the first package substrate further includes a passivation layer. The first metal layer is positioned between the passivation layer and the set of solder balls.

According to an aspect, the method incorporates the semiconductor device into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a first example that provides a semiconductor device that includes a printed circuit board (PCB), a set of solder balls and a die. The PCB includes a first metal layer. The set of solder balls is coupled to the PCB. The die is coupled to the PCB through the set of solder balls. The die includes a second metal layer and a third metal layer. The first metal layer of the PCB, the set of solder balls, the second and third metal layers of the die are configured to operate as an inductor in the semiconductor device. In some implementations, the PCB further includes a fourth metal layer. In some implementations, the first and fourth metal layers of the PCB, the set of solder balls, the second and third metal layers of the die are configured to operate as the inductor in the semiconductor device. In some implementations, the first metal layer of the PCB, the set of solder balls, the second and third metal layers of the die are configured to provide a winding for the inductor of the semiconductor device. The winding has a number of N turns that is 1 or more. In some implementations, the die further includes a passivation layer. The passivation layer is positioned between the second metal layer and the third metal layer. In some implementations, the second metal layer is positioned between the passivation layer and the set of solder balls. In some implementations, the second metal layer is a post-passivation layer.

Exemplary Wafer Level Inductor

Figure 1:
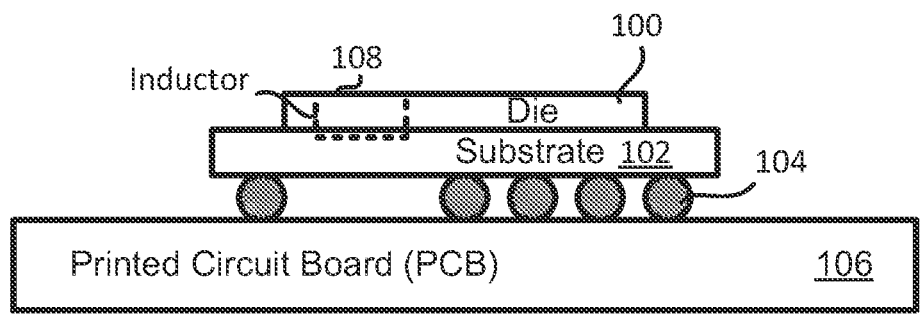
FIG. 1 illustrates a known inductor integrated in a die.
Figure 2:
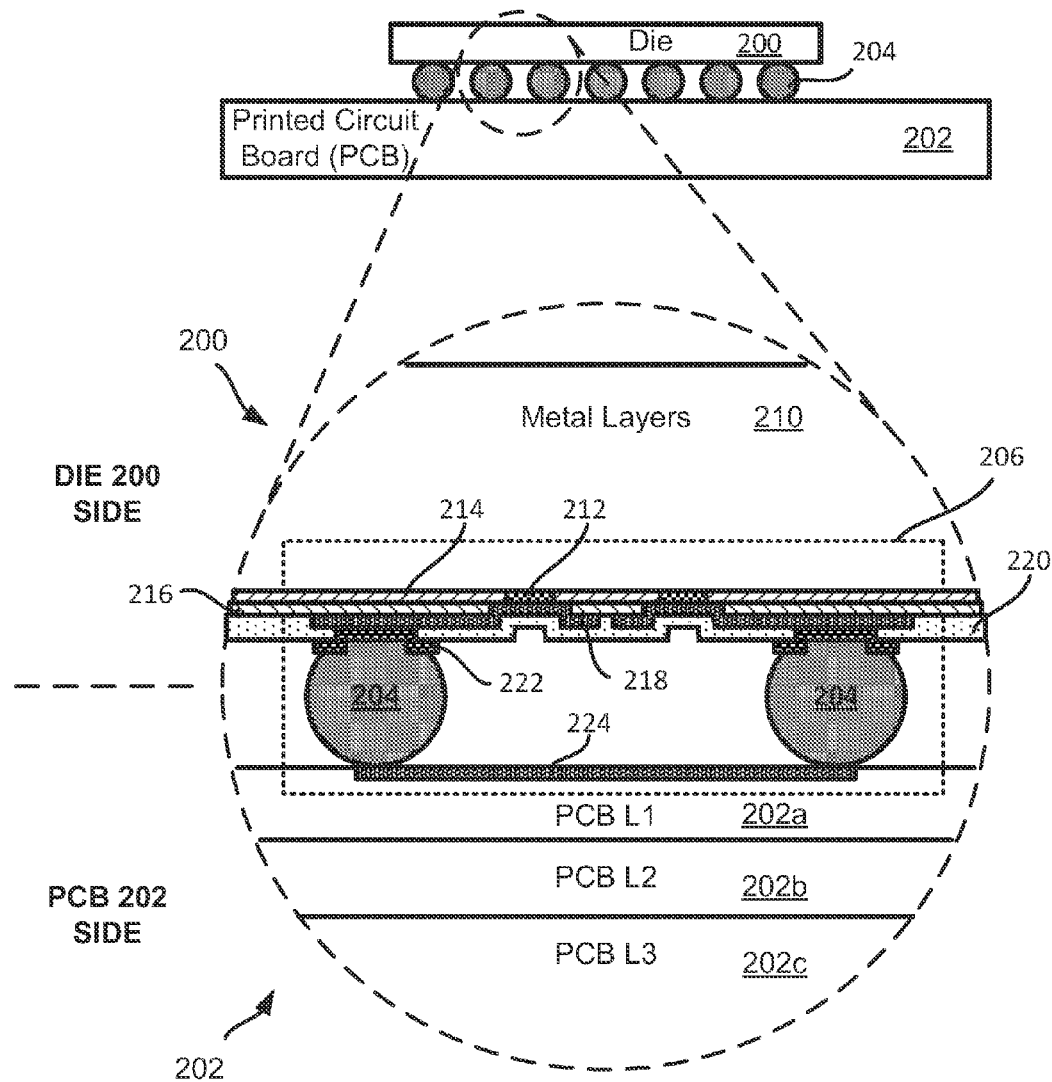
FIG. 2 illustrates an inductor defined between a die and a printed circuit board (PCB).

FIG. 2 conceptually illustrates a novel inductor for a semiconductor device. Specifically, FIG. 2 illustrates a die 200 that is coupled to a printed circuit board (PCB) 202 through a set of solder balls 204. In some implementations, the die 200 is a wafer-level packaging die (e.g., manufactured using a wafer level packaging process). FIG. 2 also conceptually illustrates an inductor 206 that is defined by components on the die 200, components on the PCB 202, and at least one solder ball 204. In some implementations, other materials may be used instead of or in conjunction with the solder ball 204. For example, in some implementations, a metal interconnect (e.g., copper) may be used. As shown in FIG. 2, the die 200 includes a first set of metal layers 210, a via 212, a passivation layer 214, a first polyimide layer 216, a second metal layer 218, a second polyimide layer 220, and a under bump metallization (UBM) layer 222. The first set of metal layers 210 are stacked metal layers in some implementations. In some implementations, a dielectric layers may be positioned between the metal layers in the first set of metal layers 210. The via 212 couples at least one of metal layer from the first set of metal layers 210 to the second metal layer 218. In some implementations, the second metal layer 218 is a post passivation layer. The post passivation layer may be referred as the post passivation interconnect (PPI) layer. The second metal layer 218 may be a copper layer 218 in some implementations. The UBM layer 222 is coupled to the second metal layer 218 (e.g., copper layer). The UBM layer 222 is coupled to a solder 204. In some implementations, a polyimide layer (e.g., first polyimide layer 216) may be an insulative layer.

As further shown in FIG. 2, the PCB 202 includes a first PCB layer 202a (e.g., PCB L1), a second PCB layer 202b (e.g., PCB L2), and a third PCB layer 202c (e.g., PCB L3). One of more of the PCB layers 200a-200c may include one or more traces. As shown in FIG. 2, the first PCB layer 202a includes a trace 224, which is coupled to the solder ball 204.

In some implementations, the inductor 206 may include a winding. The winding of the inductor 206 may be defined by at least one metal layer from the first set of metal layers 210, the via 212, the second metal layer 218, the solder 204 and the trace 224. The winding of the inductor 206 may have several turns (e.g., 2 turns). In some implementations, the inductor 206 leverages one or more traces of the PCB 202 and the solder balls 204 to provide an inductor with better inductance (L), lower resistance and better quality (Q) factor value. More specifically, the inductance generated by the trace and the height of the solder ball, and the magnetic flux between the PCB and metal layers (e.g., metal layer 210, metal layer 218) of the die 200 help increase the inductance of the inductor 206. In one example, inductors that integrate solder balls as part of the inductor are capable of more turns in a given area/space (e.g., area of the die, area of package, area of PCB) than an inductor that does not include solder balls. Inductors with more turns have better inductance (L) than inductors with fewer turns. Consequently, an inductor that includes solder balls, thus is able to be configured to have more turns, will have better inductance (L) than an inductor that does not include solder balls. This and other technical advantages of inductors that include/integrate solder balls will be described below. In addition, the solder balls 204 not only help increase the inductance of the inductor 206, but the solder balls 204 also help provide structure stability for the die 200 and the PCB 202 in some implementations.

Figure 3:
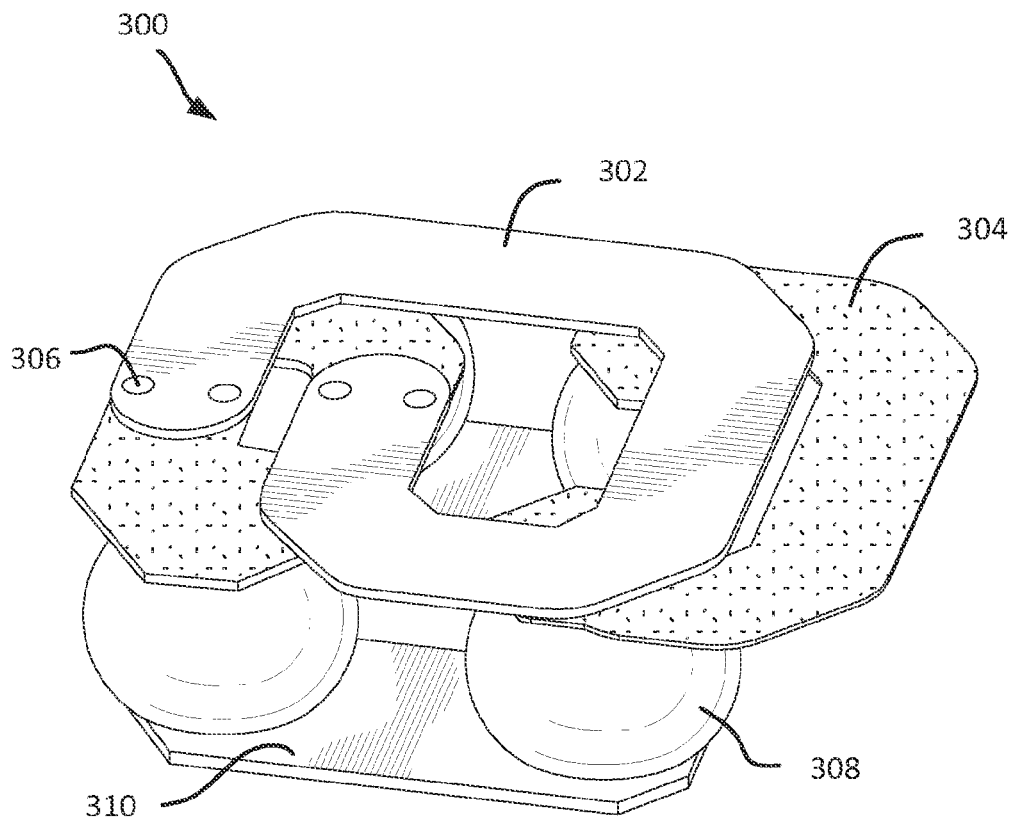
FIG. 3 illustrates a conceptual inductor having 2 turns defined between a die and a printed circuit board (PCB).
Figure 4:
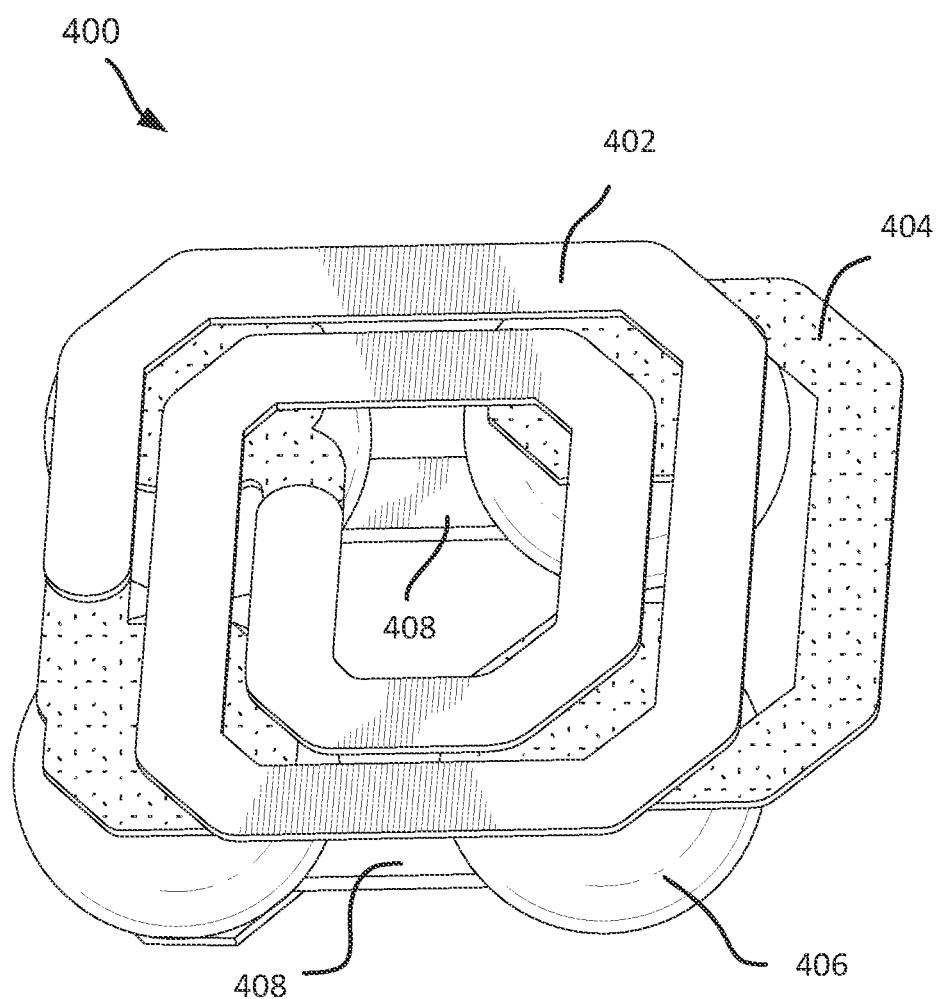
FIG. 4 illustrates a conceptual inductor having 3 turns defined between a die and a printed circuit board (PCB).

FIGS. 3-4 illustrate an inductor that is defined by components from a die, solder balls, and a printed circuit board (PCB) in some implementations. FIG. 3 illustrates an inductor 300 that includes a winding that has 2 turns. In some implementations, the winding of the inductor 300 is defined by a first metal layer 302, a second metal layer 304, a set of vias 306, a set of solder 308, and a set of traces 310. In some implementations, other materials may be used instead of or in conjunction with the solder ball 204. For example, in some implementations, a metal interconnect (e.g., copper) and/or interconnecting metal layer may be used. The first metal layer 302 may be a metal layer from stacked metal layers (e.g., stacked metal layers 210) of a die (e.g., die 200). The second metal layer 304 may be a copper layer (e.g., metal layer 218) of a die. The second metal layer 304 is coupled to the first metal layer 302 through the set of vias 306. The second metal layer 304 is also coupled to the set of solder balls 308. In some implementations, the second metal layer 304 is positioned between the set of solder balls 308 and a passivation layer (not shown) of a die. In some implementations, the die is a wafer-level packaging die (e.g., manufactured using a wafer level packaging process). The set of traces 310 may be one or more trace on a first layer of a printed circuit board (PCB) in some implementations.

FIG. 4 illustrates another inductor 400 that includes a winding. The inductor 400 is similar to the inductor 300 of FIG. 3, except that the inductor 400 has a winding that has 3 turns. In some implementations, the winding of the inductor 400 is defined by a first metal layer 402, a second metal layer 404, a set of vias (not visible), a set of solder 406, and a set of traces 408. The first metal layer 402 may be a metal layer from stacked metal layers (e.g., stacked metal layers 210) of a die (e.g., die 200). The second metal layer 404 may be a copper layer (e.g., metal layer 218) of a die. The second metal layer 404 is coupled to the first metal layer 402 through the set of vias (not visible). The second metal layer 404 is also coupled to the set of solder balls 406. In some implementations, the second metal layer 404 is positioned between the set of solder balls 406 and a passivation layer (not shown) of a die. In some implementations, the die is a wafer-level packaging die (e.g., manufactured using a wafer level packaging process). The set of traces 408 may be one or more trace on a first layer of a printed circuit board (PCB) in some implementations.

The above exemplary inductors that include/integrate solder balls as part of the inductor provide several technical advantages over known inductors (e.g., inductors that do not integrate solder balls). For example, the above exemplary inductors provide better performance/properties than known inductors. Some of the relevant properties of an inductor include effective inductance, Q factor and/or effectiveness of the coupling of the inductor. The effectiveness of an inductor may be defined by its Q factor. A Q factor is a quality factor/value that defines the efficiency of an inductor. A Q factor of an inductor may be defined as the ratio between the inductance of the inductor and the resistance of the inductor (e.g., $Q=L/R$). The higher the Q factor, the closer the inductor approaches the behavior of an ideal inductor, which is a lossless inductor. Thus, generally speaking, a higher Q factor is more desirable than a lower Q factor. In some implementations, the above exemplary inductors have better inductance (L) (e.g., higher inductance), better Q factor (e.g., higher Q factor) and better resistance (R) (e.g., lower resistance).

In some implementations, these better properties may be achieved by maximizing magnetic flux by increasing the number of turns/windings of the inductor in a given area (e.g., area of the die, area of package, area of PCB) and thus increasing the coupling between layers. As described above, integrating solder balls as part of an inductor allows for more turns in the inductor in a given area/space (e.g., area of the die, area of package, area of PCB). Thus, integrating solder balls in an inductor increases the inductance (L), which increases the Q factor of the inductor.

Another reason these inductors have better properties (e.g., better inductance) is that they leverage the height of the solder balls to increase inductance. One benefit of using an inductor that integrates solder balls is that such inductors are capable of supporting high current for high power applications. Moreover, the relatively large size of solder balls (compared to metal layers of the die that are part of the inductor) lowers the resistance of the inductor, which effectively increases the Q factor of the inductor. On a similar note, traces on a PCB that are part of an inductor are typically larger than metal layers in a die that are part of the inductor. In some implementations, these traces (that area part of the inductor) of PCB may be about 2 times wider than the metal interconnects/lines (that area part of the inductor) on the die. These wider traces have lower resistance than the narrower metal interconnects. Consequently, these wider traces lower the overall effective resistance of the inductor. As result, an inductor that integrate traces on the PCB as part of the inductor has a better Q factor (because of the lower resistance) than an inductor that is solely in a die.

Moreover, using and keeping the solder balls helps provides/maintain the structural coupling, stability, and/or rigidity of the semiconductor device, while at the same time minimizing, avoiding degradation of the magnetic flux due to solder ball effects. For example, keeping the solder balls helps reduce mechanical stress in the semiconductor device (e.g., package).

Figure 5:
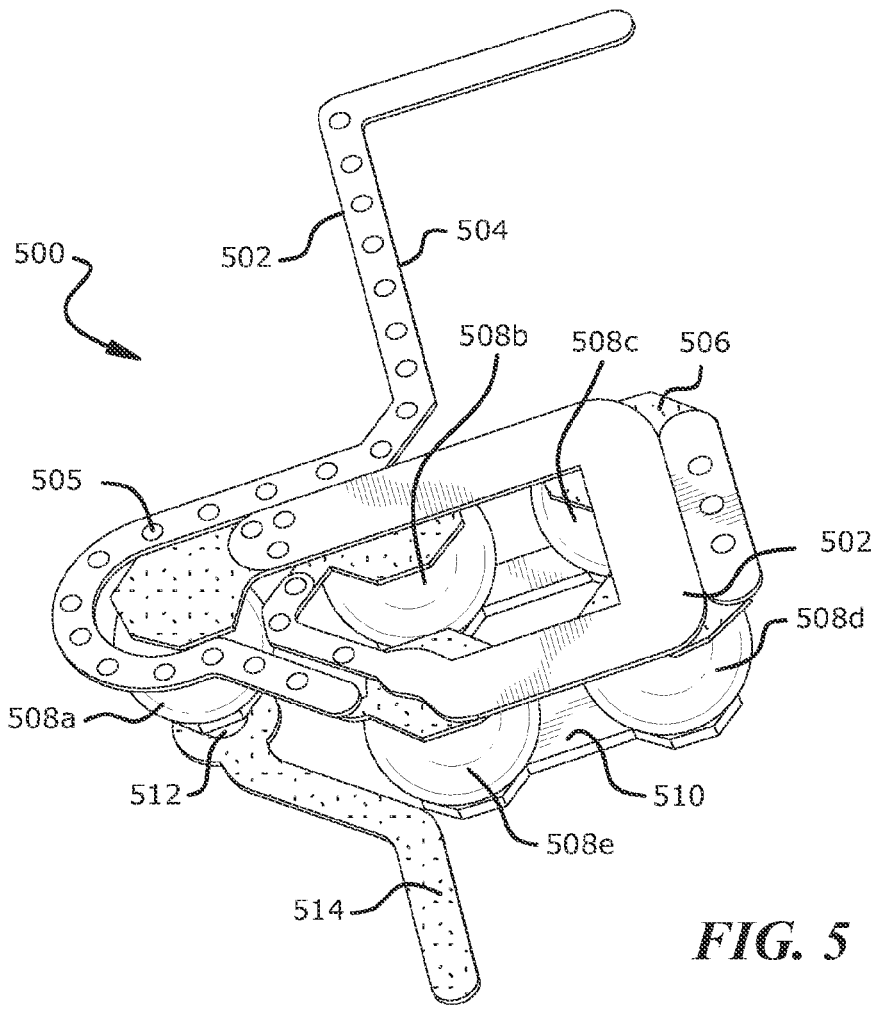
FIG. 5 illustrates an angled view of an inductor defined between a die and a printed circuit board (PCB).

FIGS. 5-8 illustrate another example of a novel inductor in some implementations. FIG. 5 illustrates an inductor 500 from an angled point of view. As shown in FIG. 5, the inductor 500 includes a first metal layer 502, a second metal layer 504, a set of vias 505, a third metal layer 506, a set of solder balls 508 (e.g., first solder ball 508a, second solder ball 508b, third solder ball 508c, fourth solder ball 508d, fifth solder ball 508e), a fourth metal layer 510, a via 512 and a fifth metal layer 514.

In some implementations, the first metal layer 502, the second metal layer 504 and the third metal 506 are metal layers of a die. For example, the first, second and third metal layers 502-506 may be one of the metal layers of the die 200 of FIG. 2. In particular, the first and second metal layers 502-504 may correspond to the metal layers 210 of FIG. 2 and the third metal layer 506 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 505 may be vias in a die in some implementations. For example, one of the vias from the set of vias 505 may correspond to the via 212 of FIG. 2. In some implementations, the set of vias 505 is positioned and configured to reduce the resistance of the inductance, thereby increasing the Q factor of the inductor.

The set of solder balls 508 provides an interconnect path/interconnect means between a die and a printed circuit board (PCB). However, other materials may be used to provide an interconnect path/interconnect means between a die and a PCB.

In some implementations, the fourth metal layer 510, the via 512 and the fifth metal layer 514 are located in a printed circuit board (PCB). For example, the fourth metal layer 510 and the fifth metal layer 514 may be metal layers of a PCB. In one example, the fourth metal layer may be the metal layer 224 of the PCB 202 of FIG. 2 in some implementations.

Figure 6:
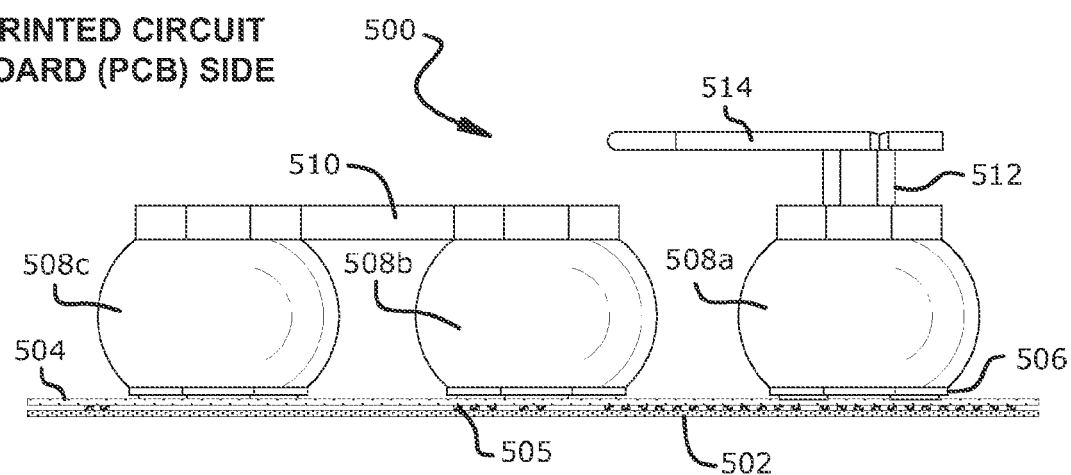
FIG. 6 illustrates a side view of an inductor defined between a die and a printed circuit board (PCB).

FIG. 6 illustrates a side view of the inductor 500 of FIG. 5. Specifically, FIG. 6 illustrates a side view of an inductor defined by metal layers of a die, solder balls and metal layers of a printed circuit board. As shown in FIG. 6, the inductor 500 includes the first metal layer 502, the second metal layer 504, the set of vias 505, the third metal layer 506, the set of solder balls 508 (e.g., first solder ball 508a, second solder ball 508b, third solder ball 508c), the fourth metal layer 510, a via 512 and a fifth metal layer 514.

In some implementations, the first metal layer 502, the second metal layer 504 and the third metal 506 are metal layers of a die. For example, the first, second and third metal layers 502-506 may be one of the metal layers of the die 200 of FIG. 2. In particular, the first and second metal layers 502-504 may correspond to the metal layers 210 of FIG. 2 and the third metal layer 506 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 505 may be vias in a die in some implementations. For example, one of the vias from the set of vias 505 may correspond to the via 212 of FIG. 2. The set of solder balls 508 provides an interconnect path/interconnect means between a die and a printed circuit board (PCB). However, other materials may be used to provide an interconnect path/interconnect means between a die and a PCB.

In some implementations, the fourth metal layer 510, the via 512 and the fifth metal layer 514 are located in a printed circuit board (PCB). For example, the fourth metal layer 510 and the fifth metal layer 514 may be metal layers of a PCB. In one example, the fourth metal layer may be the metal layer 224 of the PCB 202 of FIG. 2 in some implementations.

Figure 7:
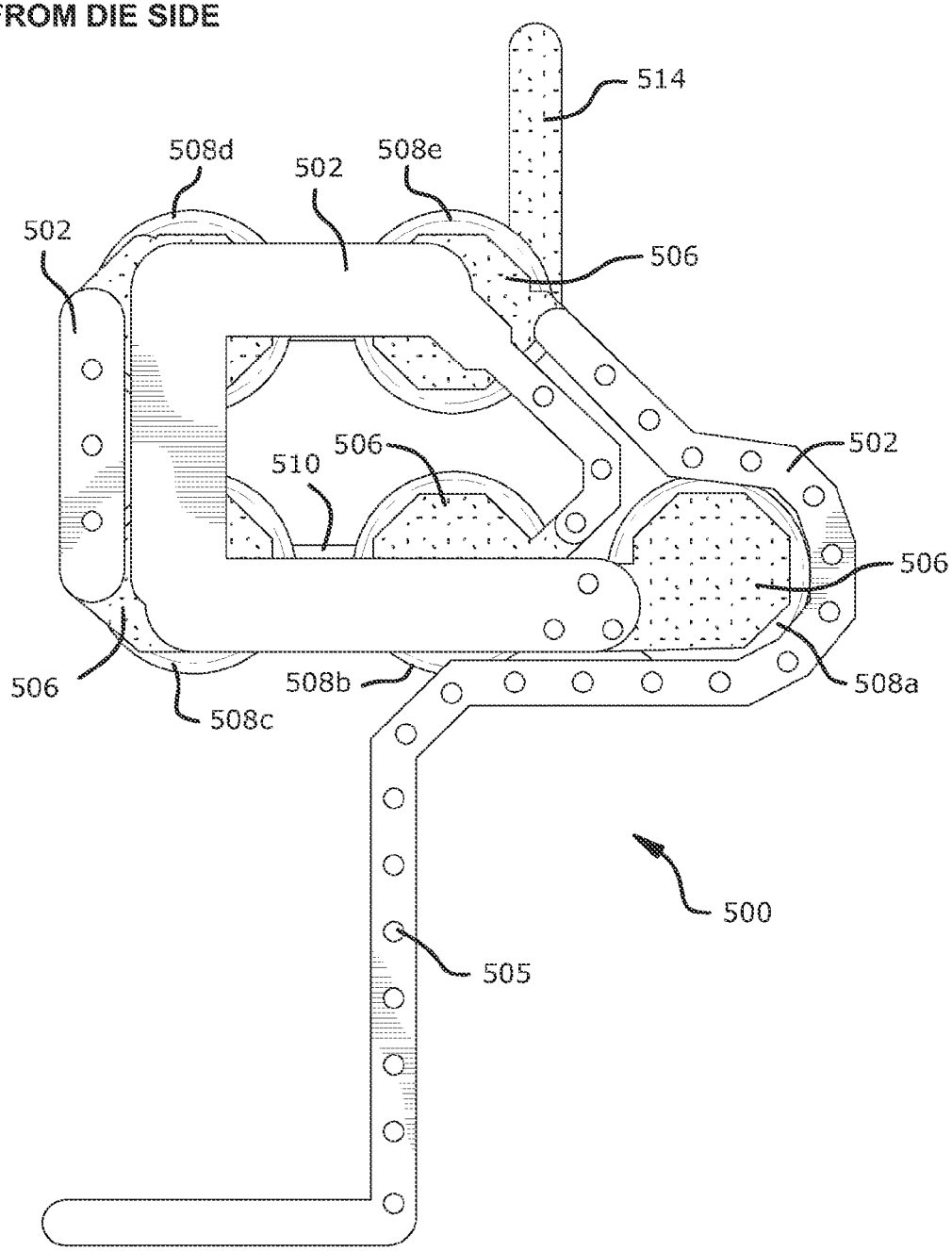
FIG. 7 illustrates a bottom view of an inductor defined between a die and a printed circuit board (PCB).

FIG. 7 illustrates a view (e.g., bottom view) of the inductor 500 of FIG. 5 from the perspective of the die. Specifically, FIG. 7 illustrates a bottom view of an inductor defined by metal layers of a die, solder balls and metal layers of a printed circuit board. It should be noted that the view of FIG. 7 may be a top view depending on how the inductor, die, and/or PCB are positioned. As shown in FIG. 7, the inductor 500 includes the first metal layer 502, the second metal layer 504, the set of vias 505, the third metal layer 506, the set of solder balls 508 (e.g., first solder ball 508a, second solder ball 508b, third solder ball 508c), the fourth metal layer 510, a via 512 and a fifth metal layer 514.

In some implementations, the first metal layer 502, the second metal layer 504 and the third metal 506 are metal layers of a die. For example, the first, second and third metal layers 502-506 may be one of the metal layers of the die 200 of FIG. 2. In particular, the first and second metal layers 502-504 may correspond to the metal layers 210 of FIG. 2 and the third metal layer 506 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 505 may be vias in a die in some implementations. For example, one of the vias from the set of vias 505 may correspond to the via 212 of FIG. 2. The set of solder balls 508 provides an interconnect path/interconnect means between a die and a printed circuit board (PCB). However, other materials may be used to provide an interconnect path/interconnect means between a die and a PCB.

In some implementations, the fourth metal layer 510, the via 512 and the fifth metal layer 514 are located in a printed circuit board (PCB). For example, the fourth metal layer 510 and the fifth metal layer 514 may be metal layers of a PCB. In one example, the fourth metal layer may be the metal layer 224 of the PCB 202 of FIG. 2 in some implementations.

Figure 8:
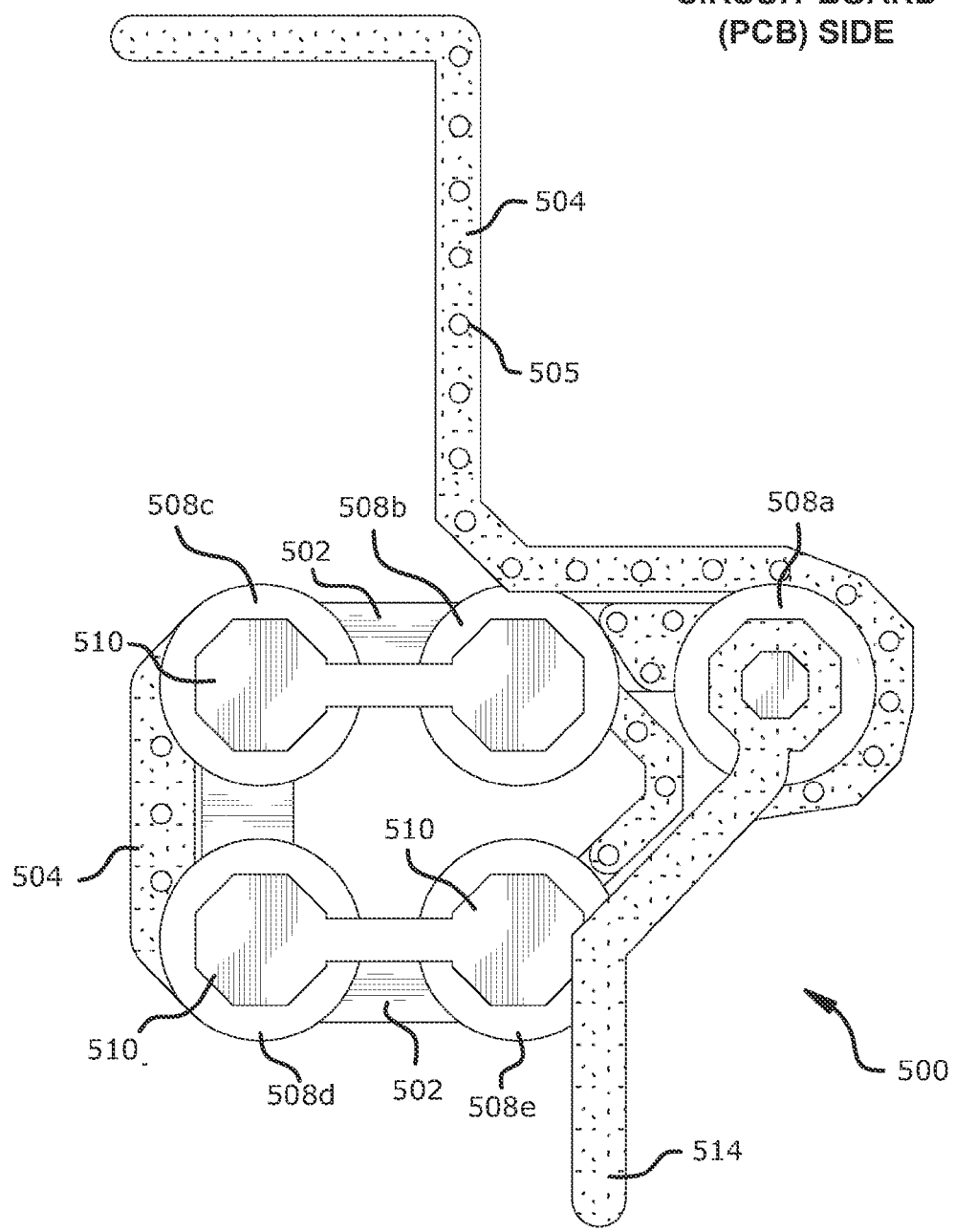
FIG. 8 illustrates a top view of an inductor defined between a die and a printed circuit board (PCB).

FIG. 8 illustrates a view (e.g., top view) of the inductor 500 of FIG. 5 from the perspective of the printed circuit board (PCB). Specifically, FIG. 8 illustrates a top view of an inductor defined by metal layers of a die, solder balls and metal layers of a printed circuit board. It should be noted that the view of FIG. 8 may be a bottom view depending on how the inductor, die, and/or PCB are positioned. As shown in FIG. 8, the inductor 500 includes the first metal layer 502, the second metal layer 504, the set of vias 505, the third metal layer 506, the set of solder balls 508 (e.g., first solder ball 508a, second solder ball 508b, third solder ball 508c), the fourth metal layer 510, a via 512 and a fifth metal layer 514.

In some implementations, the first metal layer 502, the second metal layer 504 and the third metal 506 are metal layers of a die. For example, the first, second and third metal layers 502-506 may be one of the metal layers of the die 200 of FIG. 2. In particular, the first and second metal layers 502-504 may correspond to the metal layers 210 of FIG. 2 and the third metal layer 506 may correspond to the metal layer 218 (e.g., post passivation interconnect (PPI) layer) of FIG. 2 in some implementations. In some implementations, the die is a wafer-level packaging die (e.g., manufactured using a wafer level packaging process). The set of vias 505 may be vias in a die in some implementations. For example, one of the vias from the set of vias 505 may correspond to the via 212 of FIG.

2. The set of solder balls 508 provides an interconnect path/interconnect means between a die and a printed circuit board (PCB). However, other materials may be used to provide an interconnect path/interconnect means between a die and a PCB.

In some implementations, the fourth metal layer 510, the via 512 and the fifth metal layer 514 are located in a printed circuit board (PCB). For example, the fourth metal layer 510 and the fifth metal layer 514 may be metal layers of a PCB. In one example, the fourth metal layer may be the metal layer 224 of the PCB 202 of FIG. 2 in some implementations.

FIGS. 2-8 illustrate examples of an inductor defined by components on a die, printed circuit board (PCB) and a solder ball. As shown in FIGS. 2-8, these inductors bypass the use of a packaging substrate. In other words, these inductors are free of a packaging substrate. The advantage of bypassing the use of a packaging substrate is lower cost (because of using less material) and smaller size. In some implementations, an inductor may also be defined by components on a first die, a second die, and a solder ball. These other types of inductors will be further described below.

Having described various novel inductors (e.g., inductor defined by two dies, inductor defined by two package substrates), methods for manufacturing/providing such inductors will now be described below.

Exemplary Method for Manufacturing/Providing Inductor

Figure 9:
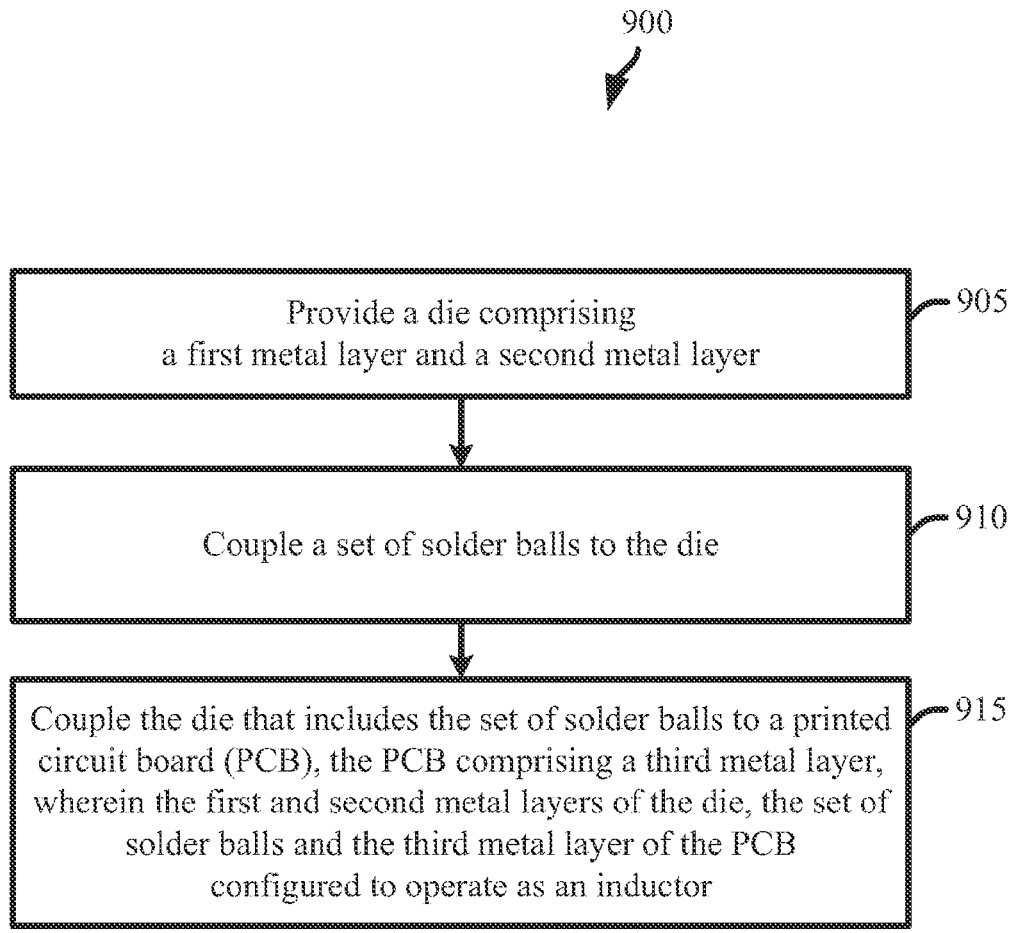
FIG. 9 illustrates a flow diagram for manufacturing/providing an inductor.

FIG. 9 illustrates a flow diagram of a method for manufacturing/providing an inductor. In some implementations, the method of FIG. 9 may be implemented to manufacture/provide the inductors described in FIGS. 2-8.

As shown in FIG. 9, the method provides (at 905) a die that includes a first metal layer and a second metal layer. The second metal may be a post passivation layer. The die may include a passivation layer. The passivation layer may be a dielectric material and may be located between the first metal layer and the second metal layer (e.g., post passivation layer) of the die. The die may also include an under bump metallization layer (UBM) layer, which is coupled to the second metal layer of the die. In some implementations, the die is manufactured using wafer level packaging. The method couples (at 910) a set of solder balls to the die. In some implementations, coupling the set of solder balls to the die includes coupling a solder ball to a UBM layer of the die. FIG. 2 illustrates an example of a solder ball coupled to a UBM layer of a die. Specifically, FIG. 2 illustrates solder ball 204 coupled to UBM 222 of die 200.

The method further couples (at 915) the die that includes the set of solder balls to a printed circuit board (PCB). The PCB includes a third metal layer. In some implementations, the PCB may include additional metal layers (e.g., fourth metal layer, fifth metal layer). Once the die is coupled to the PCB, the first and second metal layers of the die, the set of solder balls and the third metal layer of the PCB are configured to operate as an inductor. In some implementations, the additional metal layers of the PCB (e.g., fourth metal layer, fifth metal layer) along with the first and second metal layers of the die, the set of solder balls and the third metal layer of the PCB may be configured to operate as an inductor.

Another advantage of the inductor described in the disclosure is that it does not required special additional manufacturing processes.

Exemplary Inductors

Figure 10:
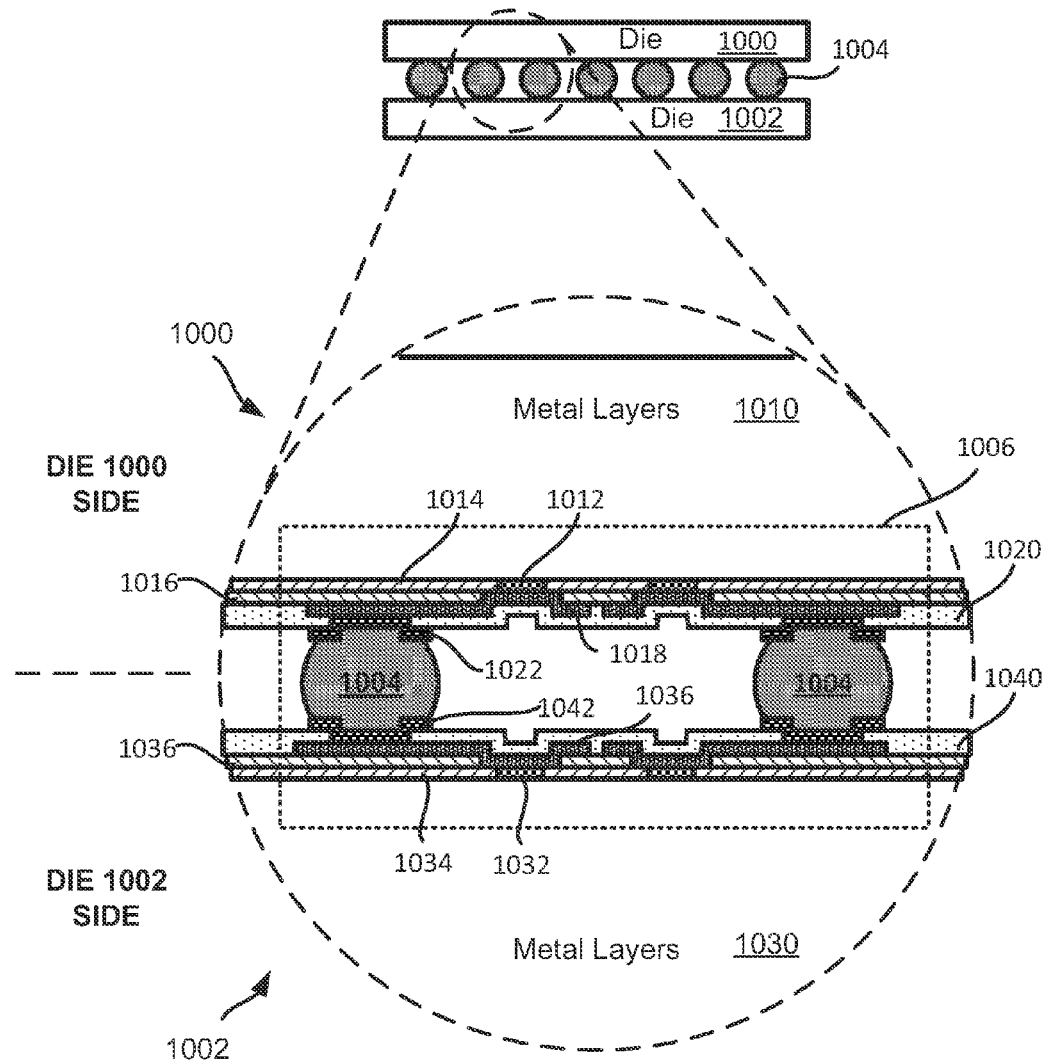
FIG. 10 illustrates an inductor defined between a first die and a second die.
Figure 11:
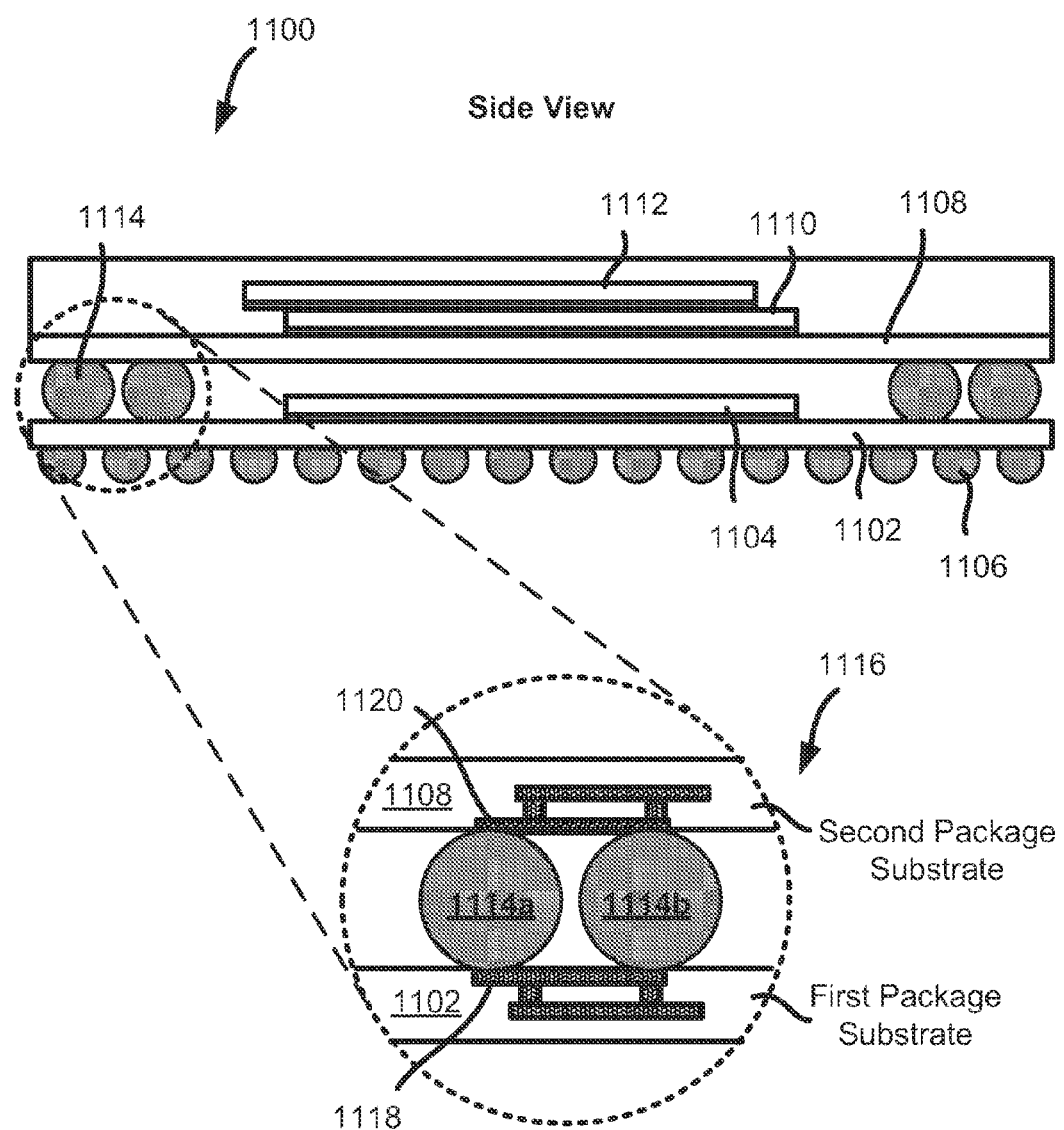
FIG. 11 illustrates an inductor in a package on package structure.

FIGS. 2-8 illustrate some examples of novel inductors. However, some implementations may also use different designs and configurations. FIGS. 10-11 illustrate other examples of novel inductors.

FIG. 10 conceptually illustrates a novel inductor for an integrated circuit (IC) device. Specifically, FIG. 10 illustrates a first die 1000 that is coupled to a second die 1002 through a set of solder balls 1004. In some implementations, the first die and/or second die are wafer-level packaging dies (e.g., manufactured using a wafer level packaging process). FIG. 10 also conceptually illustrates an inductor 1006 that is defined by components on the first die 1000, components on the second die 1002, and at least one solder ball 1004. As shown in FIG. 10, the first die 1000 includes a first set of metal layers 1010, a via 1012, a passivation layer 1014, a first polyimide layer 1016, a second metal layer 1018, a second polyimide layer 1020, and a under bump metallization (UBM) layer 1022. The first set of metal layers 1010 are stacked metal layers in some implementations. In some implementations, a dielectric layers may be positioned between the metal layers in the first set of metal layers 210. The via 1012 couples at least one of metal layer from the first set of metal layers 1010 to the second metal layer 1018. In some implementations, the second metal layer 1018 is a post passivation layer. The post passivation layer may be referred as the post passivation interconnect (PPI) layer. The second metal layer 1018 may be a copper layer 1018 in some implementations. The UBM layer 1022 is coupled to the second metal layer 1018 (e.g., copper layer). The UBM layer 1022 is coupled to a solder 1004.

As further shown in FIG. 10, the second die 1030 includes a first set of metal layers 1030, a via 1032, a passivation layer 1034, a first polyimide layer 1036, a second metal layer 1038, a second polyimide layer 1040, and an under bump metallization (UBM) layer 1042. The first set of metal layers 1030 are stacked metal layers in some implementations. The via 1032 couples at least one of metal layer from the first set of metal layers 1030 to the second metal layer 1038. The second metal layer 1038 may be a copper layer 1038 in some implementations. The UBM layer 1042 is coupled to the second metal layer 1038 (e.g., copper layer). The UBM layer 1042 is coupled to a solder 1004.

In some implementations, the inductor 1006 may include a winding. The winding of the inductor 1006 may be defined by at least one metal layer from the first set of metal layers 1010, the via 1012, the second metal layer 1018, the solder 1004, the second metal layer 1038, the via 1032, and at least one metal layer from the first set of metal layers 1030. The winding of the inductor 1006 may have several turns (e.g., 2 turns).

In some implementations, a die may be in a die package (which includes a packaging substrate). A die package may be referred to as a wafer level package. Accordingly, in some implementations, an inductor may be defined by components of a first die package, a second die package, and a set of solder balls.

Another example of a novel inductor is shown in FIG. 11. Specifically, FIG. 11 illustrates an inductor defined in a package on package (PoP) structure. As illustrated in FIG. 11, the PoP structure 1100 includes a first package substrate 1102, a first die 1104, a first set of solder balls 1106, a second package substrate 1108, a second die 1110, a third die 1112, a second set of solder balls 1114. In some implementations, the first die 1104 may be a logic die. The second and third dies 1110-1112 may be stacked memory dies in some implementations.

In some implementations, the first package of the PoP structure 1100 may includes the first package substrate 1102, the first die 1104, and the first set of solder balls 1106. The first die 1104 may be an Application Specific Integrated Circuit (ASIC) die in some implementations. In some implementations, the second package of the PoP structure 1100 may includes the second package substrate 1108, the second die 1110, the third die 1112, and the second set of solder balls 1114.

In some implementations, an inductor 1116 in the PoP structure 1100 may be defined by the second set of solder balls 1114 (e.g., solder ball 1114a, solder ball 1114b) and at least one metal layer in the first and second package substrate 1102 and 1108. Specifically, the metal layer 1118 of the first package substrate 1102, the solder ball 1114a, the solder ball 1114b, and the metal layer 1120 of the second package substrate 1108 are configured to operate as the inductor 1116 in the PoP structure 1100 in some implementations. In some implementations, the first package substrate 1102 may include additional metal layers. Similarly, the second package substrate 1108 may include additional metal layers. In some implementations, one or more additional metal layers of the first package substrate 1102 and/or second package substrate 1108 may be part of the inductor 1116. That is, in some implementations, one or more additional metal layers of the first package substrate 1102 and/or second package substrate 1108 may be configured to operate as the inductor 1116. For example, first and second metal layers of the first package substrate 1102, second and third metal layers of the second package substrate 1108, and the solder balls 1114a-b may be configured to operate as an inductor in some implementations. In FIG. 11, solder balls 1114a-b are integrated in the inductor 1116. However, in some implementations, other interconnecting means may be used in lieu of or in conjunction with the solder balls.

Having described various novel inductors (e.g., inductor defined by two dies, inductor defined by two package substrates), methods for manufacturing/providing such inductors will now be described below.

Exemplary Methods for Manufacturing/Providing Inductor

Figure 12:
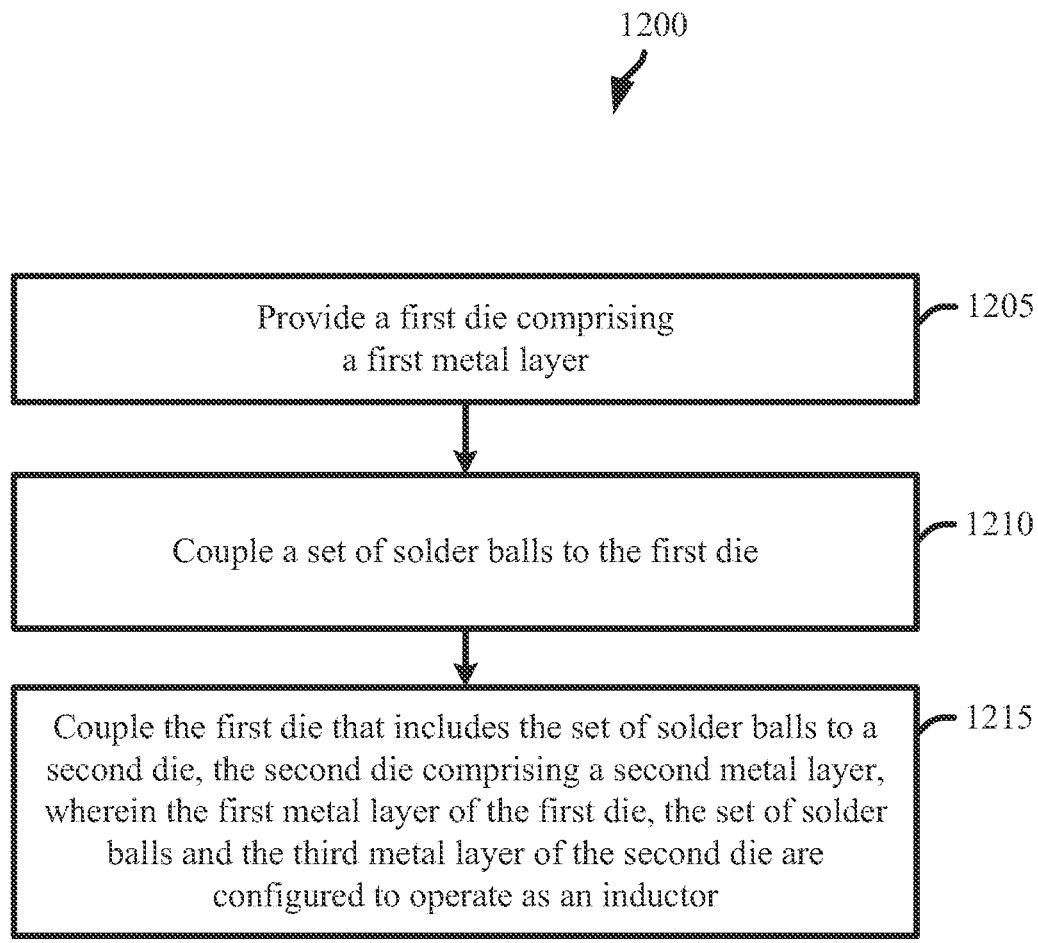
FIG. 12 illustrates a flow diagram for manufacturing/providing an inductor.

FIG. 12 illustrates a flow diagram of a method for manufacturing/providing an inductor defined by two dies and a set of solder balls. In some implementations, the method of FIG. 12 may be implemented to manufacture/provide the inductor described in FIG. 10.

As shown in FIG. 12, the method provides (at 1205) a first die that includes a first metal layer. In some implementations, the first die is manufactured using wafer level packaging. In some implementations, the first die may include additional metal layers (e.g., third metal layer). Moreover, in some implementations, one of the metal layers of the first die (e.g., first metal layer) may be a post passivation layer. The first die may include a passivation layer. The passivation layer may be a dielectric material and may be located between the first metal layer and another metal layer of the first die. The first die may also include an under bump metallization layer (UBM) layer, which is coupled to the first metal layer of the die. The method couples (at 1210) a set of solder balls to the first die. In some implementations, coupling the set of solder balls to the first die includes coupling a solder ball to a UBM layer of the first die. FIG. 10 illustrates an example of a solder ball coupled to a UBM layer of a die. Specifically, FIG. 10 illustrates solder ball 1004 coupled to UBM 1022 of die 1000.

The method further couples (at 1215) the first die that includes the set of solder balls to a second die. In some implementations, the second die is manufactured using wafer level packaging. The second die includes a second metal layer. In some implementations, the second die may include additional metal layers (e.g., fourth metal layer, fifth metal layer). Once the first die is coupled to the second die, the first metal layer of the first die, the set of solder balls and the second metal layer of the second die are configured to operate as an inductor. In some implementations, the additional metal layers of the second die (e.g., fourth metal layer, fifth metal layer) along with the first and third metal layers of the first die, the set of solder balls and the second metal layer of the second die may be configured to operate as an inductor.

Figure 13:
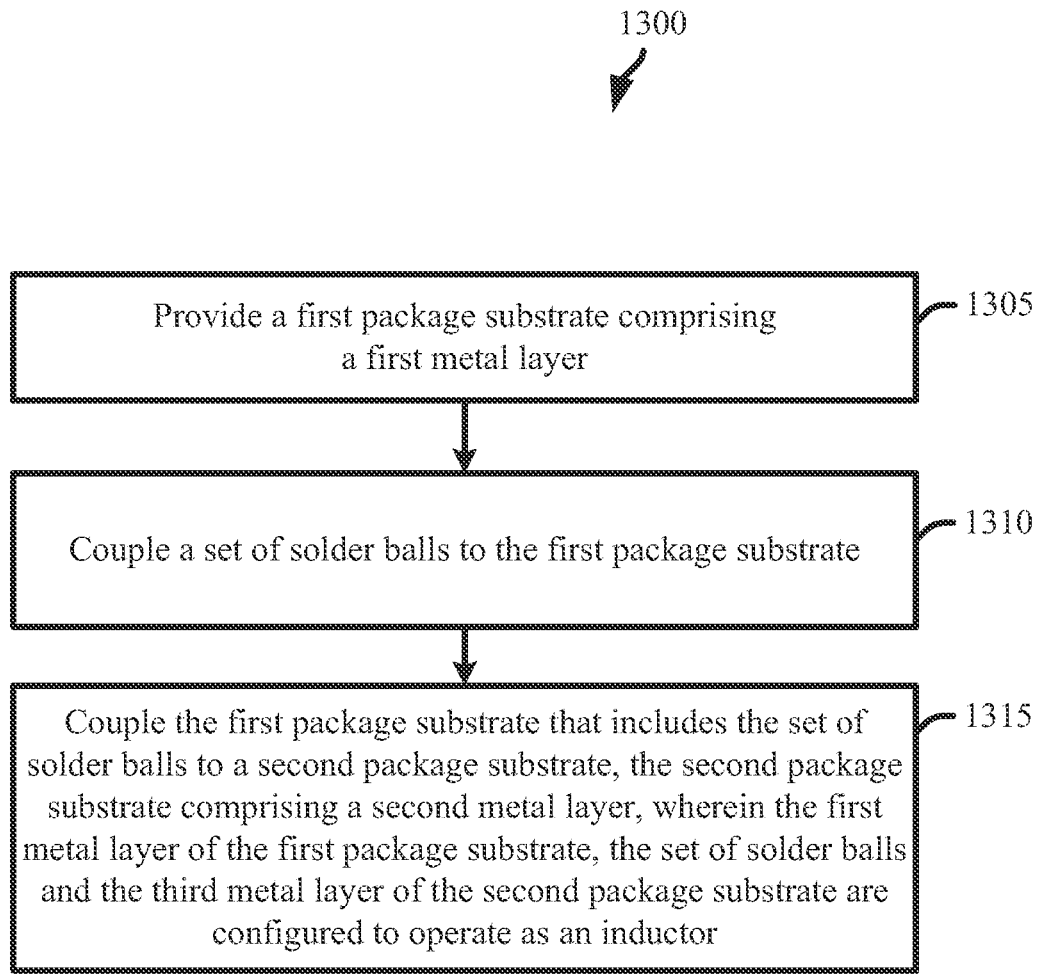
FIG. 13 illustrates a flow diagram for manufacturing/providing an inductor.

FIG. 13 illustrates a flow diagram of a method for manufacturing/providing an inductor defined by two package substrates and a set of solder balls. In some implementations, the method of FIG. 13 may be implemented to manufacture/provide the inductor described in FIG. 11.

As shown in FIG. 13, the method provides (at 1305) a first package substrate that includes a first metal layer. In some implementations, the first package substrate may include additional metal layers (e.g., third metal layer). The package substrate may include one or more dies in some implementations, The method couples (at 1310) a set of solder balls to the first package substrate.

The method further couples (at 1315) the first package substrate that includes the set of solder balls to a second package substrate. The second package substrate includes a second metal layer. In some implementations, the second package substrate may include additional metal layers (e.g., fourth metal layer, fifth metal layer). The second package substrate may also include one or more dies in some implementations. Once the first package substrate is coupled to the second package substrate, the first metal layer of the first package substrate, the set of solder balls and the second metal layer of the second package substrate are configured to operate as an inductor. In some implementations, the additional metal layers of the second package substrate (e.g., fourth metal layer, fifth metal layer) along with the first and third metal layers of the first package substrate, the set of solder balls and the second metal layer of the second package substrate may be configured to operate as an inductor.

Exemplary Electronic Devices

Figure 14:
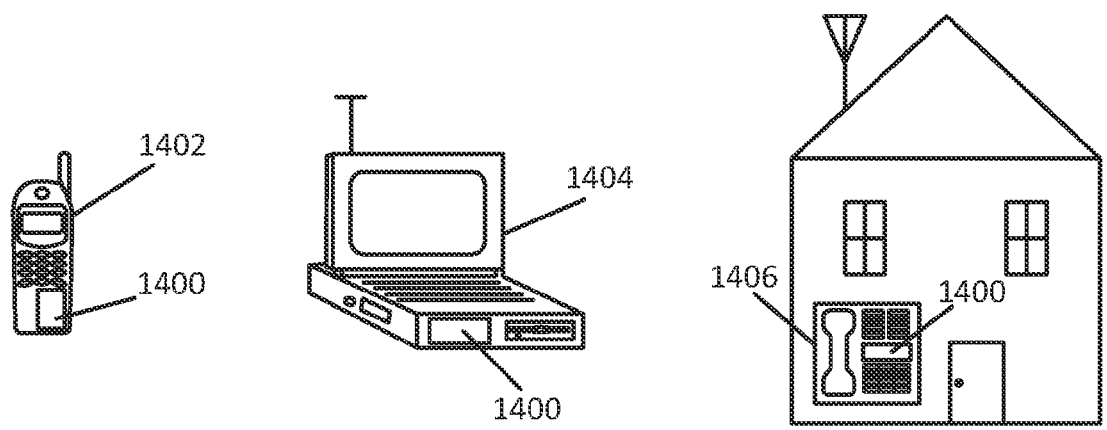
FIG. 14 illustrates various electronic devices that may be integrated with any of the aforementioned integrated circuit, die, die package and/or substrate.

FIG. 14 illustrates various electronic devices that may be integrated with any of the aforementioned integrated circuit, die or package. For example, a mobile telephone 1402, a laptop computer 1404, and a fixed location terminal 1406 may include an integrated circuit (IC) 1400 as described herein. The IC 1400 may be, for example, any of the integrated circuits, dies or packages described herein. The devices 1402, 1404, 1406 illustrated in FIG. 14 are merely exemplary. Other electronic devices may also feature the IC 1400 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13 and/or 14 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "die package" is used to refer to an integrated circuit wafer that has been encapsulated or packaged or encapsulated.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising:
    a printed circuit board (PCB) comprising a first metal layer;
    a set of solder balls coupled to the PCB; and
    a die coupled to the PCB through the set of solder balls, the die comprising a second metal layer and a third metal layer,
    wherein the first metal layer of the PCB, the set of solder balls, the second and third metal layers of the die are configured to operate as an inductor in the semiconductor device.

2. The semiconductor device of claim 1, wherein the PCB further comprises a fourth metal layer.

3. The semiconductor device of claim 2, wherein the first and fourth metal layers of the PCB, the set of solder balls, the second and third metal layers of the die are configured to operate as the inductor in the semiconductor device.

4. The semiconductor device of claim 1, wherein the first metal layer of the PCB, the set of solder balls, the second and third metal layers of the die are configured to provide a winding for the inductor of the semiconductor device, the winding having a number of N turns that is 1 or more.

5. The semiconductor device of claim 1, wherein the die further includes a passivation layer, the passivation layer positioned between the second metal layer and the third metal layer.

6. The semiconductor device of claim 5, wherein the second metal layer is positioned between the passivation layer and the set of solder balls.

7. The semiconductor device of claim 5, wherein the second metal layer is a post-passivation layer.

8. The semiconductor device of claim 1, wherein the first metal layer of the PCB is a trace.

9. The semiconductor device of claim 1, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. A semiconductor device comprising:
    a printed circuit board (PCB) comprising a first metal layer;
    an interconnect means coupled to the PCB; and
    a die coupled to the PCB through interconnect means, the die comprising a second metal layer and a third metal layer,
    wherein the first metal layer of the PCB, the interconnect means, the second and third metal layers of the die are configured to operate as an inductor in the semiconductor device.

11. The semiconductor device of claim 10, wherein the PCB further comprises a fourth metal layer.

12. The semiconductor device of claim 11, wherein the first and fourth metal layers of the PCB, the interconnect means, the second and third metal layers of the die are configured to operate as the inductor in the semiconductor device.

13. The semiconductor device of claim 10, wherein the first metal layer of the PCB, the interconnect means, the second and third metal layers of the die are configured to provide a winding for the inductor of the semiconductor device, the winding having a number of N turns that is 1 or more.

14. The semiconductor device of claim 10, wherein the die further includes a passivation layer, the passivation layer positioned between the second metal layer and the third metal layer.

15. The semiconductor device of claim 14, wherein the second metal layer is positioned between the passivation layer and the interconnect means.

16. The semiconductor device of claim 14, wherein the second metal layer is a post-passivation layer.

17. The semiconductor device of claim 10, wherein the first metal layer of the PCB is a trace.

18. The semiconductor device of claim 10, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

19. A semiconductor device comprising:
    a first die comprising a first metal layer;

a set of solder balls coupled to the first die; and a second die coupled to the first die through the set of solder balls, the second die comprising a second metal layer, wherein the first metal layer of the first die, the set of solder balls, the second metal layer of the second die are configured to operate as an inductor in the semiconductor device.

20. The semiconductor device of claim 19, wherein the first die further comprises a third layer metal layer and the second die further comprises a fourth metal layer.

21. The semiconductor device of claim 20, wherein the first and third metal layers of the first die, the set of solder balls, the second and fourth metal layers of the second die are configured to operate as the inductor in the semiconductor device.

22. The semiconductor device of claim 19, wherein the first die further includes a first passivation layer and the second die further includes a second passivation layer.

23. The semiconductor device of claim 22, wherein the first metal layer is positioned between the first passivation layer and the set of solder balls, and the second metal layer is positioned between the second passivation layer and the set of solder balls.

24. The semiconductor device of claim 19, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

25. A semiconductor device comprising:

a first die comprising a first metal layer;

an interconnect means coupled to the first die; and a second die coupled to the first die through the interconnect means, the second die comprising a second metal layer, wherein the first metal layer of the first die, the interconnect means, the second metal layer of the second die are configured to operate as an inductor in the semiconductor device.

26. The semiconductor device of claim 25, wherein the first die further comprises a third layer metal layer and the second die further comprises a fourth metal layer.

27. The semiconductor device of claim 26, wherein the first and third metal layers of the first die, the interconnect means, the second and fourth metal layers of the second die are configured to operate as the inductor in the semiconductor device.

28. The semiconductor device of claim 25, wherein the first die further includes a first passivation layer and the second die further includes a second passivation layer.

29. The semiconductor device of claim 28, wherein the first metal layer is positioned between the first passivation layer and the interconnect means, and the second metal layer is positioned between the second passivation layer and the set of solder balls.

30. The semiconductor device of claim 25, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

31. A semiconductor device comprising:

a first package substrate comprising a first metal layer;

a set of solder balls coupled to the first package substrate; and a second package substrate coupled to the first package substrate through the set of solder balls, the second package substrate comprising a second metal layer, wherein the first metal layer of the first package substrate, the set of solder balls, the second metal layer of the second package substrate are configured to operate as an inductor in the semiconductor device.

32. The semiconductor device of claim 31, wherein the first package substrate further comprises a third layer metal layer and the second package substrate further comprises a fourth metal layer.

33. The semiconductor device of claim 32, wherein the first and third metal layers of the first package substrate, the set of solder balls, the second and fourth metal layers of the second package substrate are configured to operate as the inductor in the semiconductor device.

34. The semiconductor device of claim 31, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

35. A semiconductor device comprising:

a first package substrate comprising a first metal layer;

an interconnect means coupled to the first package substrate; and a second package substrate coupled to the first package substrate through the interconnect means, the second package substrate comprising a second metal layer, wherein the first metal layer of the first package substrate, the interconnect means, the second metal layer of the second package substrate are configured to operate as an inductor in the semiconductor device.

36. The semiconductor device of claim 35, wherein the first package substrate further comprises a third layer metal layer and the second package substrate further comprises a fourth metal layer.

37. The semiconductor device of claim 36, wherein the first and third metal layers of the first package substrate, the interconnect means, the second and fourth metal layers of the second package substrate are configured to operate as the inductor in the semiconductor device.

38. The semiconductor device of claim 35, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

39. A method for providing an inductor a semiconductor device, comprising:

providing a die comprising a first metal layer and a second metal layer;

coupling a set of solder balls to the die; and coupling the die to a printed circuit board (PCB) through the set of solder balls, the PCB comprising a third metal layer, wherein the coupling of the die to the PCB forms the inductor in the semiconductor device, the inductor defined by the first metal layer, the second metal layer, the set of solder balls, and the third metal layer.

40. The method of claim 39, wherein the PCB further comprises a fourth metal layer.

41. The method of claim 40, wherein the inductor defined by the first metal layer, the second metal layer, the set of solder balls, the third metal layer and the fourth metal layer.

42. The method of claim 39, wherein the die further includes a passivation layer, the passivation layer positioned between the first metal layer and the second metal layer.

43. The method of claim 42, wherein the first metal layer is positioned between the passivation layer and the set of solder balls.

44. The method of claim 39, further comprising incorporating the semiconductor device into at least one of a music player, a video player, an entertainment unit, a navigation device, a communications device, a mobile device, a mobile phone, a smartphone, a personal digital assistant, a fixed location terminal, a tablet computer, and/or a laptop computer.

45. A method for providing an inductor in a semiconductor device, comprising:
provIding a first die comprising a first metal layer;
coupling a set of solder balls to the first die; and
coupling the first die to a second die through the set of solder balls, the second die comprising a second metal layer, wherein the coupling of the first die to the second die forms the inductor in the semiconductor device, the inductor defined by the first metal layer, the set of solder balls, and the second metal layer.

46. The method of claim 45, wherein the first die further comprises a third metal layer.

47. The method of claim 46, wherein the inductor defined by the first metal layer, the third metal layer, the set of solder balls, and the second metal layer.

48. The method of claim 45, wherein the first die further includes a passivation layer, the first metal layer positioned between the passivation layer and the set of solder balls.

49. The method of claim 45, further comprising incorporating the semiconductor device into at least one of a music player, a video player, an entertainment unit, a navigation device, a communications device, a mobile device, a mobile phone, a smartphone, a personal digital assistant, a fixed location terminal, a tablet computer, and/or a laptop computer.

50. A method for providing an inductor in a semiconductor device, comprising:
providing a first package substrate comprising a first metal layer;
coupling a set of solder balls to the first package substrate; and
coupling the first package substrate to a second package substrate through the set of solder balls, the second package substrate comprising a second metal layer, wherein the coupling of the first package substrate to the second package substrate forms the inductor in the semiconductor device, the inductor defined by the first metal layer, the set of solder balls, and the second metal layer.

51. The method of claim 50, wherein the first package substrate further comprises a third metal layer.

52. The method of claim 51, wherein the inductor defined by the first metal layer, the third metal layer, the set of solder balls, and the second metal layer.

53. The method of claim 50, wherein the first package substrate further includes a passivation layer, the first metal layer positioned between the passivation layer and the set of solder balls.

54. The method of claim 50, further comprising incorporating the semiconductor device into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *